(12) United States Patent
Juds et al.

(10) Patent No.: US 8,487,606 B2
(45) Date of Patent: Jul. 16, 2013

(54) SENSOR ASSEMBLY, TRIP UNIT INCLUDING THE SAME, AND METHOD OF MANUFACTURING A SENSOR ASSEMBLY

(75) Inventors: Mark A. Juds, New Berlin, WI (US); Paul J. Rollmann, Brown Deer, WI (US); Brad R. Leccia, Bethel Park, PA (US); Steven Z. Chen, Moon Township, PA (US); James J. Benke, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 345 days.

(21) Appl. No.: 12/911,805

(22) Filed: Oct. 26, 2010

(65) Prior Publication Data

US 2012/0098519 A1   Apr. 26, 2012

(51) Int. Cl.
*G01R 19/00* (2006.01)
(52) U.S. Cl.
USPC .................. 324/76.11; 324/126; 324/127
(58) Field of Classification Search
USPC ....... 324/76.11, 110; 336/175, 211; 174/73.1; 374/143
See application file for complete search history.

(56) References Cited

U.S. PATENT DOCUMENTS

| | | | |
|---|---|---|---|
| 3,891,863 A | 6/1975 | Kleen et al. | |
| 4,074,193 A * | 2/1978 | Kohler | 324/126 |
| 4,963,819 A * | 10/1990 | Clarke et al. | 324/126 |
| 6,140,810 A * | 10/2000 | Bohnert et al. | 324/96 |
| 7,239,490 B2 | 7/2007 | Benke | |
| 7,280,338 B2 | 10/2007 | Juds et al. | |
| 8,294,477 B2 * | 10/2012 | Handshoe et al. | 324/686 |
| 2005/0280423 A1 | 12/2005 | Barbour et al. | |
| 2007/0115008 A1 * | 5/2007 | Barth et al. | 324/713 |

FOREIGN PATENT DOCUMENTS

| | | |
|---|---|---|
| EP | 0 809 115 A2 | 11/1997 |
| WO | WO 2010058435 A1 * | 5/2010 |

OTHER PUBLICATIONS

European Patent Office, "International Search Report and Written Opinion", Sep. 14, 2012, 12 pp.

\* cited by examiner

*Primary Examiner* — Arleen M Vazquez
*Assistant Examiner* — Hoang X Nguyen
(74) *Attorney, Agent, or Firm* — Eckert Seamans Cherin & Mellott, LLC; Kirk D. Houser

(57) ABSTRACT

A sensor assembly includes an electrical conductor, at least one of a voltage sensor and a current sensor disposed about the electrical conductor, and a first insulator molded about the electrical conductor. The first insulator includes a plurality of structures structured to maintain concentricity between the electrical conductor and the at least one of the voltage sensor and the current sensor. A second insulator is molded about the first insulator and the at least one of the voltage sensor and the current sensor.

22 Claims, 6 Drawing Sheets

SENSOR ASSEMBLY, TRIP UNIT INCLUDING THE SAME, AND METHOD OF MANUFACTURING A SENSOR ASSEMBLY

BACKGROUND

1. Field

The disclosed concept pertains generally to sensor assemblies and, more particularly, to such sensor assemblies for electrical conductors, such as, for example, current and/or voltage sensors for power conductors. The disclosed concept also pertains to methods of manufacturing sensor assemblies. The disclosed concept further pertains to trip units including a sensor assembly.

2. Background Information

Circuit interrupters, such as circuit breakers, provide protection for electrical systems from electrical fault conditions such as, for example, current overloads, short circuits and abnormal voltage conditions. Typically, circuit breakers include a spring powered operating mechanism, which opens electrical contacts to interrupt the current through the conductors of the electrical system in response to abnormal conditions.

Vacuum circuit interrupters are typically used, for instance, to reliably interrupt medium voltage alternating current (AC) and, also, high voltage AC of several thousands of amperes or more.

Medium voltage circuit interrupters operate at voltages of from about 1 kV to about 42 kV.

U.S. Pat. No. 7,280,338 discloses a back-pack power supply module including various electrical connections to a circuit breaker. Suitable insulation and spacing are employed between electrical conductors, in order to avoid potential breakdown to the medium voltage conductors of the circuit breaker. The circuit breaker includes an operating mechanism having a trip unit and a motor actuator. A suitable module combines a voltage sensor, a current sensor and a parasitic power supply for the trip unit.

There is room for improvement in sensor assemblies for electrical switching apparatus.

There is also room for improvement in methods of manufacturing such sensor assemblies.

There is further room for improvement in trip units for electrical switching apparatus.

SUMMARY

These needs and others are met by embodiments of the disclosed concept, in which a first insulator is molded about an electrical conductor, the first insulator comprising a plurality of structures structured to maintain concentricity between the electrical conductor and at least one of a voltage sensor and a current sensor. A second insulator is molded about the first insulator and the at least one of the voltage sensor and the current sensor.

In accordance with one aspect of the disclosed concept, a sensor assembly comprises: an electrical conductor; at least one of a voltage sensor and a current sensor disposed about the electrical conductor; a first insulator molded about the electrical conductor, the first insulator comprising a plurality of structures structured to maintain concentricity between the electrical conductor and the at least one of the voltage sensor and the current sensor; and a second insulator molded about the first insulator and the at least one of the voltage sensor and the current sensor.

The electrical conductor may be an elongated electrical conductor; and the plurality of structures may be further structured to maintain axial spacing between the voltage sensor and the current sensor along the elongated electrical conductor.

The plurality of structures may be further structured to improve accuracy of the at least one of the voltage sensor and the current sensor and to prevent corona.

The first insulator may be a first layer of dielectric insulation molded about the electrical conductor; the second insulator may be a second layer of dielectric insulation molded about the first insulator; and the plurality of structures may be further structured to eliminate air pockets between the first and second insulators, and between the first and second insulators and the at least one of the voltage sensor and the current sensor.

The first insulator may be a first layer of dielectric insulation molded about the electrical conductor; and the second insulator may be a second layer of dielectric insulation molded about the first insulator and the at least one of the voltage sensor and the current sensor.

The plurality of structures may be a plurality of elongated ridges; the at least one of the voltage sensor and the current sensor may comprise a voltage sensor having a circular cross section and a current sensor having a circular cross section; and the plurality of elongated ridges may maintain concentricity of the circular cross section of the voltage sensor and the current sensor with respect to the electrical conductor.

The plurality of structures may be a first plurality of elongated ridges and a second plurality of ridges disposed on the first plurality of elongated ridges; the at least one of the voltage sensor and the current sensor may comprise a voltage sensor having a circular cross section and a current sensor having a circular cross section; the first plurality of elongated ridges may maintain concentricity of the circular cross section of the voltage sensor and the current sensor with respect to the electrical conductor; and the second plurality of ridges may maintain axial separation between the voltage sensor and the current sensor.

As another aspect of the disclosed concept, a trip unit comprises: a processor; and a sensor assembly comprising: an electrical power conductor, at least one of a voltage sensor and a current sensor disposed about the electrical power conductor and being structured to provide at least one signal to the processor, a first insulator molded about the electrical power conductor, the first insulator comprising a plurality of structures structured to maintain concentricity between the electrical power conductor and the at least one of the voltage sensor and the current sensor, and a second insulator molded about the first insulator and the at least one of the voltage sensor and the current sensor.

As another aspect of the disclosed concept, a method manufactures a sensor assembly comprising an electrical conductor and at least one of a voltage sensor and a current sensor. The method comprises: molding a first insulator about the electrical conductor, the first insulator comprising a plurality of structures structured to maintain concentricity between the electrical conductor and the at least one of the voltage sensor and the current sensor; disposing the at least one of the voltage sensor and the current sensor on the plurality of structures about the electrical conductor; and molding a second insulator about the first insulator and the at least one of the voltage sensor and the current sensor.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "electrical conductor" shall mean a wire (e.g., solid; stranded; insulated; non-insulated), a copper conductor, an aluminum conductor, a suitable metal conductor, or other suitable material or object that permits an electric current to flow easily.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "corona" shall mean a faint glow low current level discharge adjacent to the surface of an electrical conductor at a medium voltage potential, which occurs when the potential gradient (the strength of the electric field) exceeds a certain value, but conditions are insufficient to cause complete electrical breakdown or arcing.

As employed herein, the term "medium voltage" shall mean a voltage in the range of about 1 kV to about 42 kV.

Referring to FIGS. 1-4, a two-step molding process maintains concentricity between a number of sensors 2 (FIG. 4) and an electrical conductor, such as the example copper medium voltage (MV) power conductor 4 of a sensor assembly 6.

Figure 4:
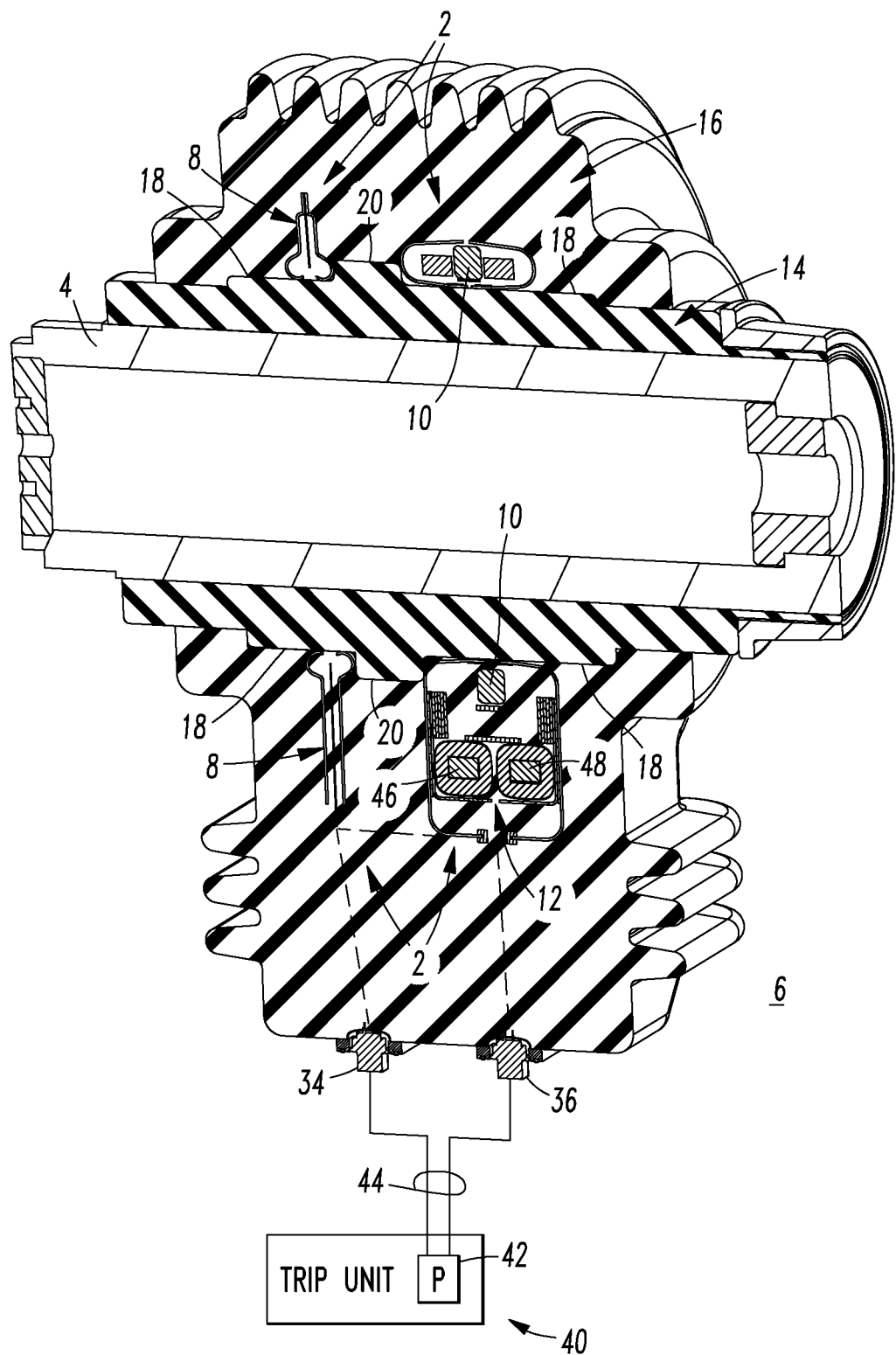
FIG. 4 is a cross sectional view of a sensor assembly including a voltage sensor, a current sensor, a self-power transformer, electrical connectors, a power conductor, and first and second layers of molded dielectric insulation in accordance with embodiments of the disclosed concept.

In the example of FIG. 4, the number of sensors 2 include a relatively small voltage sensor 8, a current sensor 10 and a self-power transformer 12. This permits the overall size of the sensor assembly 6 to be relatively small, which is important in connection with maintaining a desired pole-to-pole spacing (not shown) in a circuit interrupter (not shown). Here, the example two-step molding process provides a first insulator, such as a first layer of dielectric insulation 14 (e.g., without limitation, molded epoxy), and a second insulator, such as a second layer of dielectric insulation 16 (e.g., without limitation, molded epoxy), molded about the first insulator and the number of sensors 2. As will be discussed, this also maintains axial spacing between the sensors 8,10 along the example elongated power conductor 4, and within the sensor assembly 6 during encapsulation. The concentricity and axial spacing of the sensors 8,10 achieves the desired sensor accuracy and prevents corona.

Figure 1:
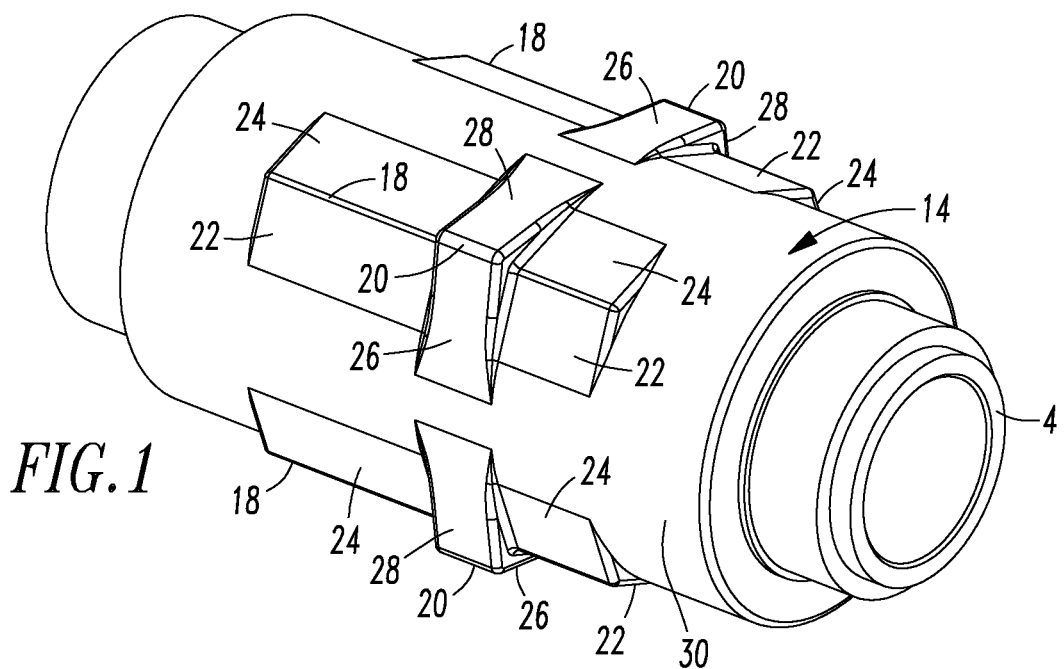
FIG. 1 is an isometric view of a power conductor including a first layer of molded dielectric insulation having a plurality of first and second ridges in accordance with embodiments of the disclosed concept.
Figure 2:
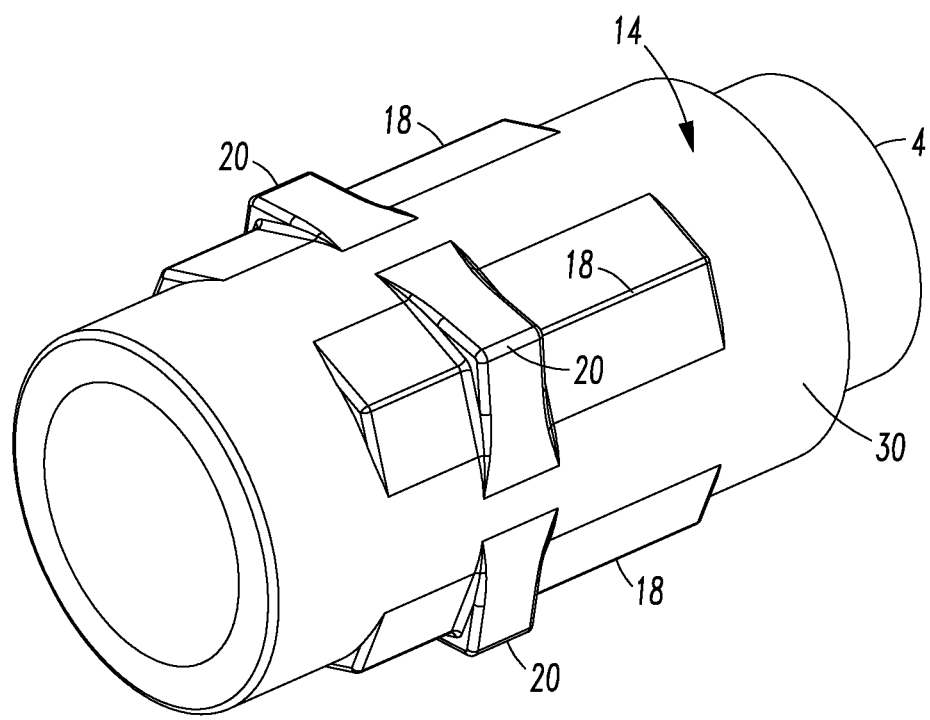
FIG. 2 is another isometric view of the power conductor and the first layer of molded dielectric insulation of FIG. 1.

As shown in FIGS. 1 and 2, the first layer of dielectric insulation 14 is molded about the example power conductor 4. The dielectric insulation 14 includes a plurality of structures, such as the example first ridges 18 and the example second ridges 20 to prevent the formation of air bubbles (not shown) during the molding of the second layer of dielectric insulation 16 (FIG. 4). The example four first ridges 18 (three are shown in FIGS. 1 and 2) maintain concentricity of the circular voltage and current sensors 8,10 (FIG. 4) with respect to the power conductor 4. The example four second ridges 20 (three are shown in FIGS. 1 and 2) locate the sensors 8,10 axially on the power conductor 4 and within the sensor assembly 6, and maintain axial separation or space between the sensors 8,10. The elongated sloping sides 22,24 and the sloping sides 26,28 of the respective ridges 18 and 20 prevent the formation of air pockets (not shown) during molding of the second layer of dielectric insulation 16.

Figure 6:
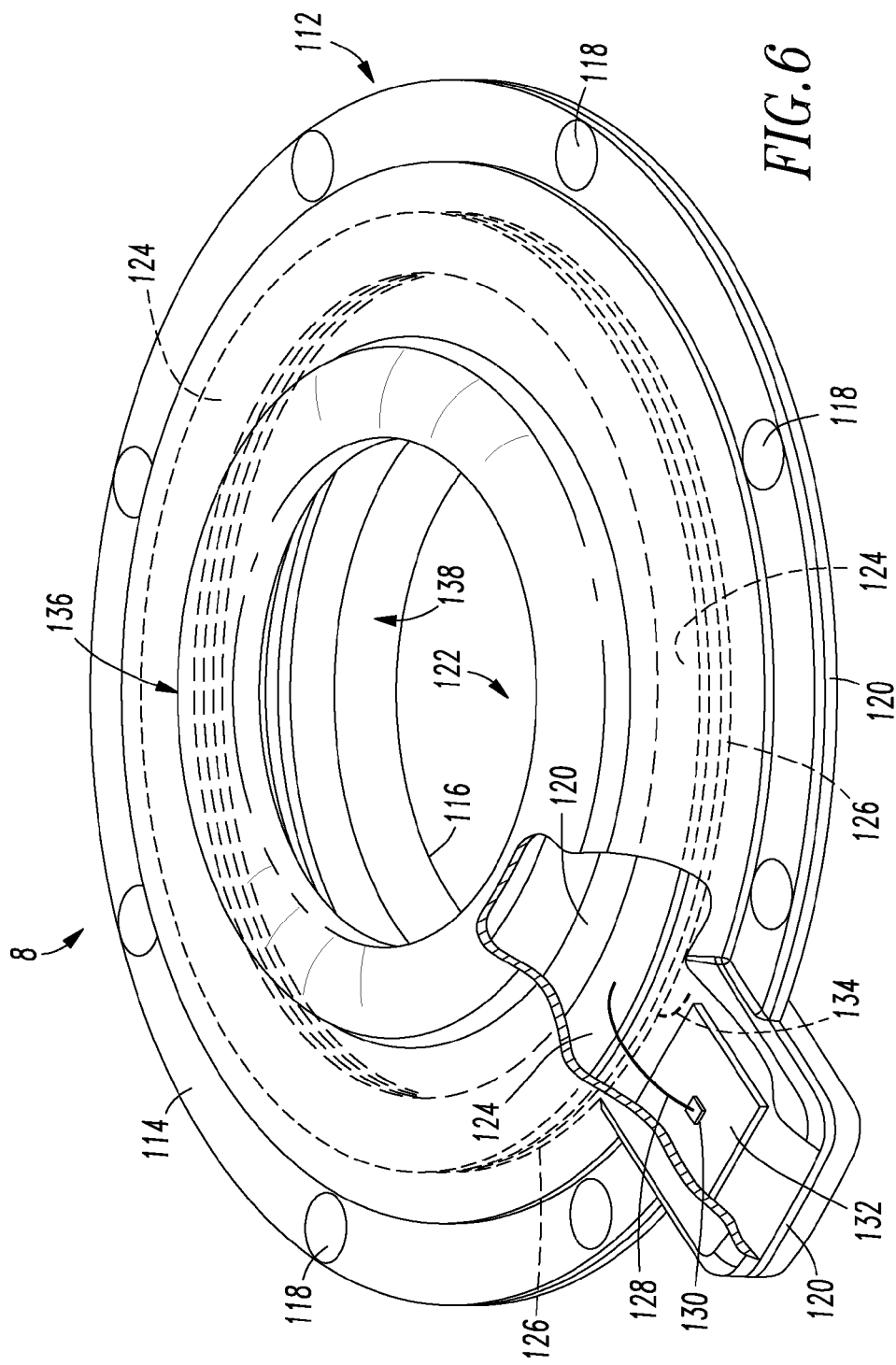
FIG. 6 is an isometric view of a voltage sensor suitable for use with the sensor assembly of FIG. 4.

The second ridges 20 are disposed on the first elongated ridges 18 and extend to the surface 30 of the first layer of dielectric insulation 14. Both of the voltage sensor 8 and the current sensor 10 have a circular cross section as can be seen in FIGS. 6 (only the voltage sensor 8 is shown) and 7 (half of the two circular cross sections are shown). The first elongated ridges 18 advantageously maintain concentricity of the circular cross section of the sensors 8,10 with respect to the power conductor 4. The second ridges 20 advantageously maintain axial separation between the voltage sensor 8 and the current sensor 10 as is shown in FIG. 4. The first elongated ridges 18 are advantageously structured suitably long enough to support each sensor and are oriented parallel to the axis of the power conductor 4, and tangent to the surface 30 of the first layer of dielectric insulation 14. Regardless of the rotation angle of the structure of FIG. 1 about the longitudinal axis of the power conductor 4, this advantageously prevents the entrainment of air (not shown) (e.g., air bubbles; air pockets) in the second layer of dielectric insulation 16 during the molding thereof.

Corona is prevented internally in the first and second layers of dielectric insulation 14,16 by maintaining concentricity of the sensors 8,10 with respect to the example power conductor 4, by maintaining sufficient thickness of dielectric encapsulating material of the first and second layers of dielectric insulation 14,16, and by eliminating potential air pockets between such first and second layers, and between such layers and the sensors 8,10. Corona is prevented externally on the power conductor 4 by maintaining sufficient distance over the external surface of the first and second layers of dielectric insulation 14,16 with the ridges on the outside surface of the second layer of dielectric insulation 16, and through the air from end to end of the power conductor 4 and from the power conductor 4 to the electrical connectors 34,36 with suitable spacing being provided between parts (e.g., power conductor 4, voltage sensor assembly 8, current sensor assembly 10,12, and electrical connectors 34,36).

Figure 3:
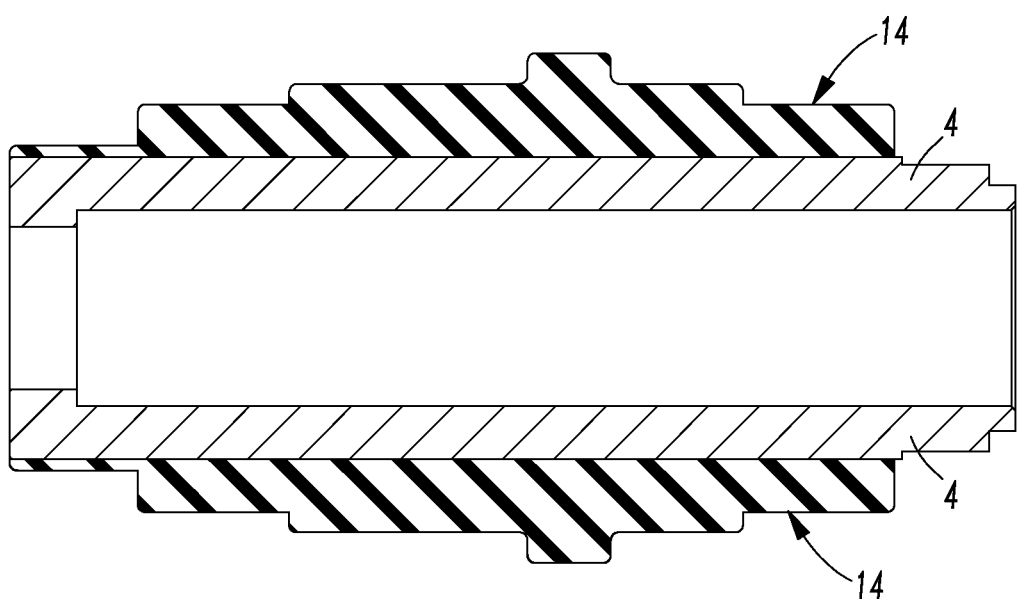
FIG. 3 is a cross sectional view of the power conductor and the first layer of molded dielectric insulation of FIG. 1.

FIG. 3 shows the power conductor 4 with the first layer of dielectric insulation 14.

Referring to FIG. 4, the sensor assembly 6 includes the power conductor 4 and the first and second layers of dielectric insulation 14,16. Disposed within the second layer of dielectric insulation 16 are the voltage sensor 8, the current sensor 10, the self-power transformer 12 and two electrical connectors 34,36, which extend from the second layer at the bottom of FIG. 4. The first elongated ridges 18 maintain concentricity of the circular voltage and current sensors 8,10 with respect to the power conductor 4. The second ridges 20 locate the sensors 8,10 axially on the power conductor 4 and within the sensor assembly 6, and maintain axial separation (space) between the sensors 8,10.

As can now be seen, the sensor assembly 6 includes the electrical conductor 4, the number of sensors 2 disposed about the electrical conductor 4, the first insulator 14 molded about the electrical conductor 4, and the second insulator 16 molded about the first insulator 14 and the number of sensors 2. The first insulator 14 includes a plurality of structures, such as the example first elongated ridges 18 and second ridges 20, structured to maintain concentricity between the electrical conductor 4 and the number of sensors 2.

As shown in FIG. 4, a trip unit 40 includes a processor (P) 42 and the sensor assembly 6. The number of sensors 2 provide at least one signal 44 to the processor 42. The example self-power transformer 12 includes first and second parasitic power current transformers 46,48 that parasitically generate power from at least one of current flowing in the electrical conductor 4 and voltage of the electrical conductor 4, and provide power to the voltage sensor 8 and the processor 42.

Figure 5:
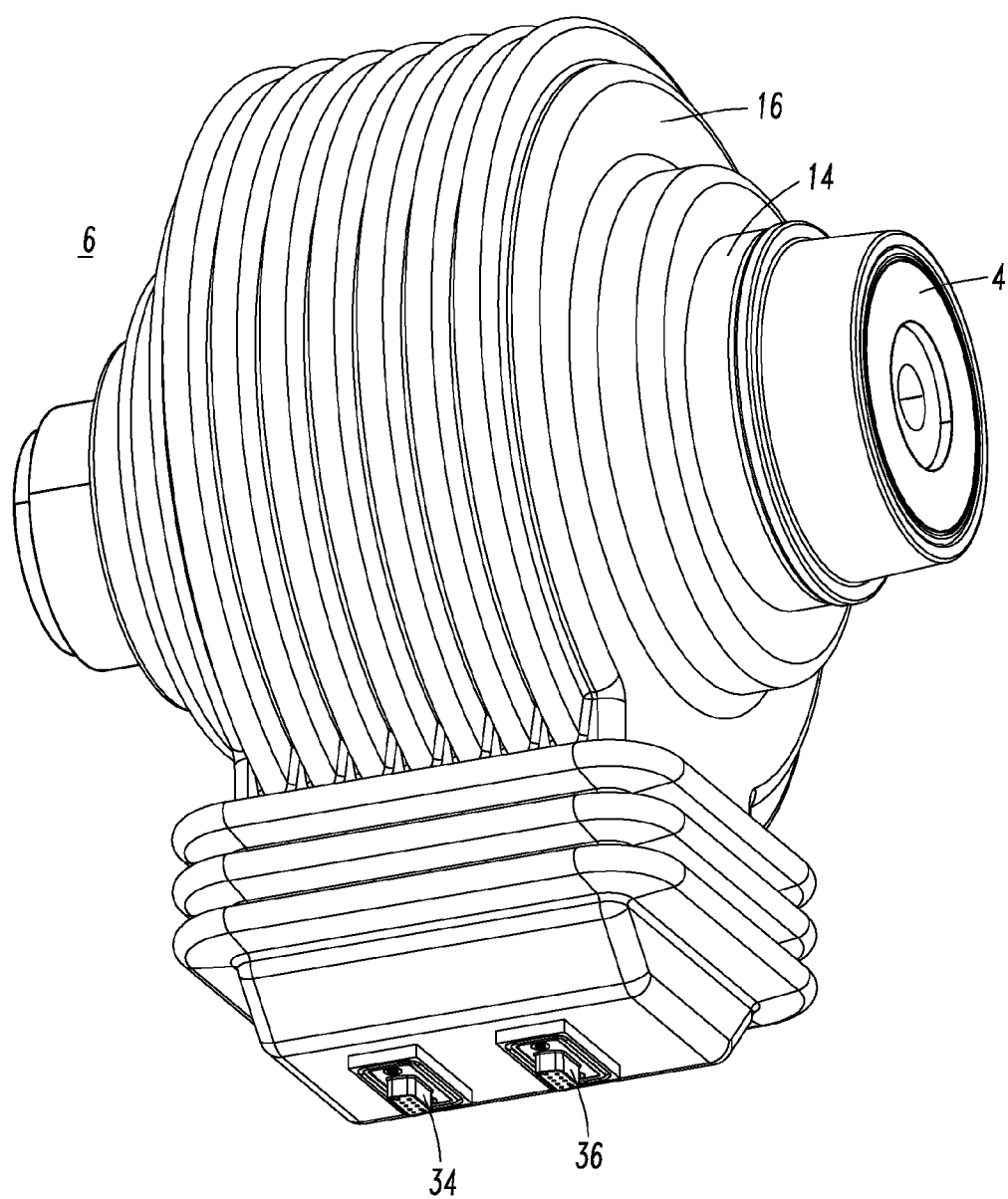
FIG. 5 is an isometric view of the sensor assembly of FIG. 4.

FIG. 5 shows the sensor assembly 6 including the power conductor 4, the first and second layers of dielectric insulation 14,16, and the electrical connectors 34,36.

FIG. 6 shows the voltage sensor 8, which has two capacitors (not expressly shown) in series formed therein to form a capacitor divider. The voltage of the power conductor 4 (FIGS. 1 to 5) is divided across these two capacitors. The first capacitor (Csc) is between the voltage sensor 8 and the power conductor 4. The second capacitor (Csg) is between the voltage sensor 8 and ground at, for example, grounded voltage sensor shield 112. The sensor voltage (Vs) across the second capacitor (Csg) needs to be much lower than the voltage (Vc) on the power conductor 4, in order to prevent damage to sensor electronics. The sensor voltage (Vs) is defined by the following equations:

$$Vs/Vc = Csc/(Csc+Csg)$$

$$Vs = Vc*Csc/(Csc+Csg)$$

In particular, the second capacitor (Csg) is between a first or sensor electrode (sensor ring) 124 and a second or grounded electrode (ground ring) 126, and the first capacitor (Csc) is between the sensor ring 124 and the power conductor 4. The capacitance of Csc is about 1,000 times smaller than the capacitance of Csg.

The voltage sensor 8 includes the grounded voltage sensor shield 112, which may be constructed of injected-molded plastic plated with a metal, such as, for example, nickel and/or copper. Other alternatives include stamped metal, a metal mesh/screen, or a combination of the aforementioned materials. Sensor shield 112 is a faraday shield having a generally circular shape. In one embodiment, sensor shield 112 may be constructed having a top shield 114 and a bottom shield 116 fastened together with rivets 118. An electrical insulator or electrically insulating substrate 120 having a generally disk shape is positioned between top and bottom shields 114,116. Electrical insulator 120 has an opening 122 therein to receive a line conductor (such as the power conductor 4 of FIGS. 1-5). The electrical insulator 120 can be a printed circuit board (PCB). Alternatively, the electrical insulator 120 can be a thin (approximately 0.002 in), insulated support sheet comprising a material such as, for example, Kapton®.

The first or sensor electrode 124 and the second or grounded electrode 126 are affixed to or formed on the electrical insulator 120 about the opening 122 thereof. In one embodiment, first and second electrodes 124,126 are formed using a printing, painting, electro-deposition, or metal spraying process to deposit a layer of conductive material, such as copper, for example, on electrical insulator 120. Wired connection 128 connects first electrode 124 to a contact pad 130 of a readout circuit 132. Wired connection 134 connects second electrode 126 to grounded voltage sensor shield 112.

Radius corners or edge portions 136,138 of top and bottom shields 114,116 have a curved profile, which minimizes electric-field concentration and arcing on edge portions 136,138 and helps to prevent dielectric breakdown. Alternatively, curled edge portions 136,138 may be formed by attaching a large diameter wire ring (not shown) to top and bottom shields 114,116. The curvature of edge portions 136,138 also allows first and second electrodes 124,126 to be placed closer to a power conductor, therefore decreasing the overall size of voltage sensor 8.

Figure 7:
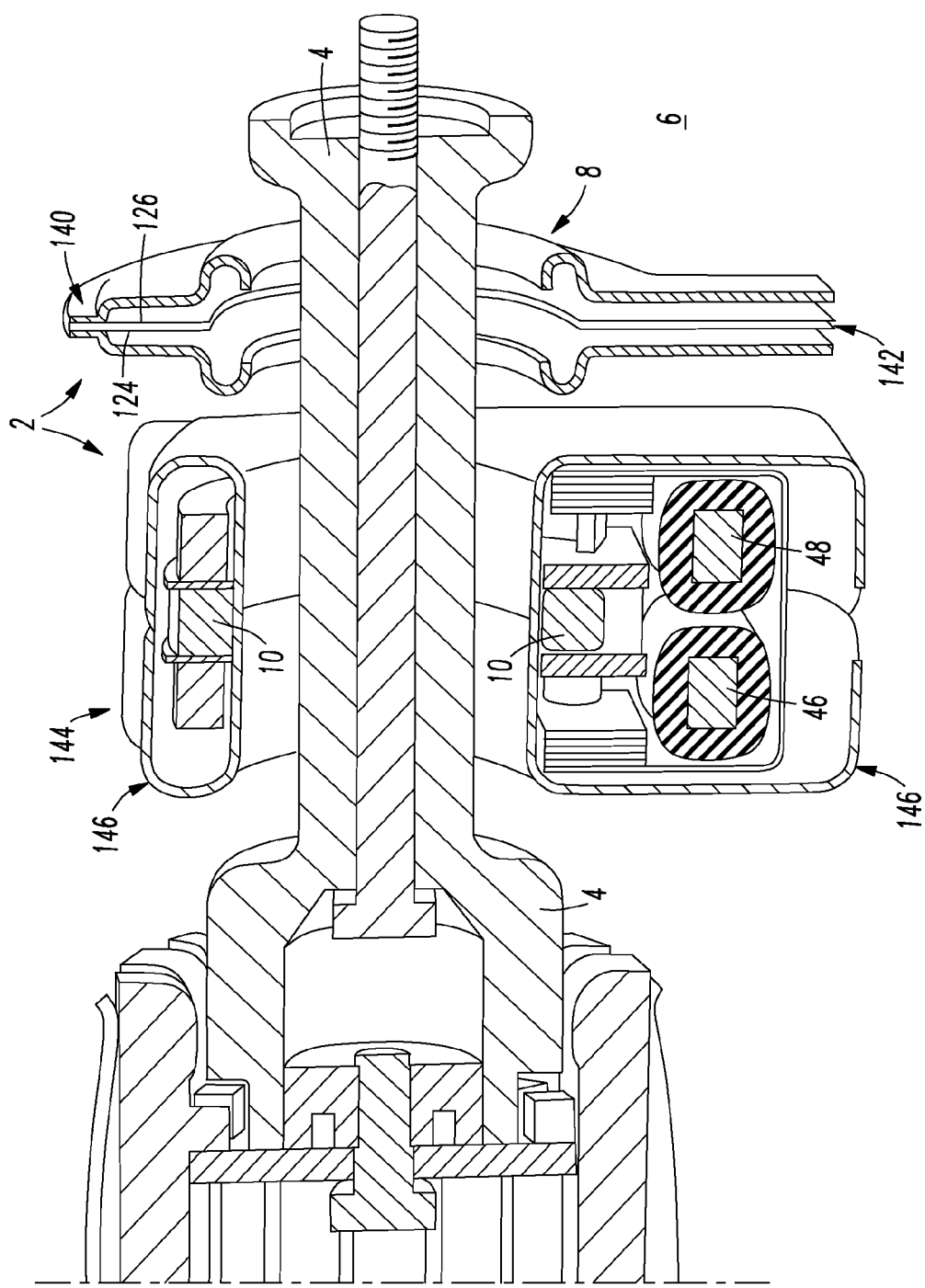
FIG. 7 is an isometric cross sectional view of the sensor assembly of FIG. 4 without the first and second layers of molded dielectric insulation.

FIG. 7 shows the sensor assembly 6 without the first and second layers of dielectric insulation 14,16 of FIG. 4. The example voltage sensor 8 includes a voltage shield or housing 140 and a printed circuit board (PCB) 142. In addition to voltage sensor 8, sensor assembly 6 also includes an example current sensor assembly 144 having a housing or shield 146 to prevent dielectric breakdown from the power conductor 4. Shield 146 surrounds the current sensor 10 and the first and second parasitic power current transformers (CTs) 46,48. Accordingly to one embodiment, current sensor 10 is a Rogowski coil that detects the current in power conductor 4. CTs 46,48 parasitically generate power from at least one of current flowing in the power conductor 4 and voltage of the power conductor 4, and provide power to the voltage sensor 8 and to trip unit 40 (FIG. 4).

Wired connections (not shown) from voltage sensor 8 and current sensor assembly 144, respectively, electrically connect to electrical connectors 34,36 (FIG. 4), respectively, and allow transmission of sensor signals from the sensors 8,10 to trip unit processor 42 (FIG. 4).

The first and second layers of dielectric insulation 14,16 (FIGS. 1 to 4) prevent dielectric breakdown between power conductor 4 and the shields 140,146 (FIG. 7), and also between voltage sensor 8 and current sensor assembly 144.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A sensor assembly comprising:
   an electrical conductor;
   at least one of a voltage sensor and a current sensor disposed about said electrical conductor;
   a first insulator molded in direct contact with said electrical conductor, said first insulator comprising a plurality of structures structured to maintain concentricity between said electrical conductor and said at least one of the voltage sensor and the current sensor; and a second insulator molded about said first insulator and in direct contact with said at least one of the voltage sensor and the current sensor.

2. The sensor assembly of claim 1 wherein said electrical conductor is a medium voltage power conductor.

3. The sensor assembly of claim 1 wherein said electrical conductor is a straight, elongated electrical conductor having a longitudinal axis; and wherein said plurality of structures are further structured to maintain axial spacing between the voltage sensor and the current sensor along the longitudinal axis of said straight, elongated electrical conductor.

4. The sensor assembly of claim 1 wherein said plurality of structures are further structured to improve accuracy of said at least one of the voltage sensor and the current sensor and to prevent corona.

5. The sensor assembly of claim 1 wherein said first insulator is a first layer of dielectric insulation molded about said electrical conductor; wherein said second insulator is a second layer of dielectric insulation molded about said first insulator; and wherein said plurality of structures are further structured to eliminate air pockets between said first and second insulators, and between said first and second insulators and said at least one of the voltage sensor and the current sensor.

6. The sensor assembly of claim 1 wherein said electrical conductor is a copper power conductor.

7. The sensor assembly of claim 1 wherein said first insulator is a first layer of dielectric insulation molded in direct contact with said electrical conductor; and wherein said second insulator is a second layer of dielectric insulation molded about said first insulator and in direct contact with said at least one of the voltage sensor and the current sensor.

8. The sensor assembly of claim 7 wherein said plurality of structures are a plurality of elongated ridges; wherein said at least one of the voltage sensor and the current sensor comprises a voltage sensor having a circular cross section and a current sensor having a circular cross section; and wherein said plurality of elongated ridges maintain concentricity of the circular cross section of said voltage sensor and said current sensor with respect to said electrical conductor.

9. The sensor assembly of claim 7 wherein said plurality of structures are a first plurality of elongated ridges and a second plurality of ridges disposed on said first plurality of elongated ridges; wherein said at least one of the voltage sensor and the current sensor comprises a voltage sensor having a circular cross section and a current sensor having a circular cross section; wherein said first plurality of elongated ridges maintain concentricity of the circular cross section of said voltage sensor and said current sensor with respect to said electrical conductor; and wherein said second plurality of ridges maintain axial separation between the voltage sensor and the current sensor.

10. The sensor assembly of claim 7 wherein said plurality of structures are a plurality of ridges structured to prevent formation of air bubbles in said second layer during molding of said second layer.

11. The sensor assembly of claim 10 wherein some of said plurality of ridges comprise two elongated sloping sides.

12. The sensor assembly of claim 7 wherein said plurality of structures are a first plurality of elongated ridges and a second plurality of ridges disposed on said first plurality of elongated ridges; and wherein said first plurality of elongated ridges are structured to prevent the entrainment of air in said second layer of dielectric insulation.

13. The sensor assembly of claim 1 wherein said at least one of the voltage sensor and the current sensor is a Rogowski coil structured to sense current flowing in said electrical conductor.

14. The sensor assembly of claim 1 wherein said at least one of the voltage sensor and the current sensor comprises a voltage sensor, a current sensor, and a self-power transformer.

15. The sensor assembly of claim 14 wherein a shield surrounds said current sensor; and wherein said self-power transformer comprises first and second parasitic power current transformers.

16. The sensor assembly of claim 15 wherein said first and second parasitic power current transformers parasitically generate power from at least one of current flowing in said electrical conductor and voltage of said electrical conductor, and provide power to said voltage sensor.

17. The sensor assembly of claim 1 wherein said at least one of the voltage sensor and the current sensor is a voltage sensor comprising a capacitive divider.

18. A trip unit comprising:
a processor; and
a sensor assembly comprising:
an electrical power conductor,
at least one of a voltage sensor and a current sensor disposed about said electrical power conductor and being structured to provide at least one signal to said processor,
a first insulator molded in direct contact with said electrical power conductor, said first insulator comprising a plurality of structures structured to maintain concentricity between said electrical power conductor and said at least one of the voltage sensor and the current sensor, and
a second insulator molded about said first insulator and in direct contact with said at least one of the voltage sensor and the current sensor.

19. The trip unit of claim 18 wherein said at least one of the voltage sensor and the current sensor comprises a voltage sensor, a current sensor, and a self-power transformer; and wherein said self-power transformer comprises first and second parasitic power current transformers.

20. The trip unit of claim 19 wherein said first and second parasitic power current transformers parasitically generate power from at least one of current flowing in said electrical power conductor and voltage of said electrical power conductor, and provide power to said voltage sensor and said processor.

21. The trip unit of claim 18 wherein said first insulator is a first layer of dielectric insulation molded about said electrical power conductor; wherein said second insulator is a second layer of dielectric insulation molded about said first insulator and said at least one of the voltage sensor and the current sensor; wherein said plurality of structures are a first plurality of elongated ridges and a second plurality of ridges disposed on said first plurality of elongated ridges; wherein said at least one of the voltage sensor and the current sensor comprises a voltage sensor having a circular cross section and a current sensor having a circular cross section; wherein said first plurality of elongated ridges maintain concentricity of the circular cross section of said voltage sensor and said current sensor with respect to said electrical power conductor; and wherein said second plurality of ridges maintain axial separation between the voltage sensor and the current sensor.

22. A method of manufacturing a sensor assembly comprising an electrical conductor and at least one of a voltage sensor and a current sensor, said method comprising:

molding a first insulator in direct contact with said electrical conductor, said first insulator comprising a plurality of structures structured to maintain concentricity between said electrical conductor and said at least one of the voltage sensor and the current sensor;

disposing said at least one of the voltage sensor and the current sensor on said plurality of structures about said electrical conductor; and molding a second insulator about said first insulator and in direct contact with said at least one of the voltage sensor and the current sensor.

* * * * *